(12) United States Patent
Ota

(10) Patent No.: US 8,826,847 B2
(45) Date of Patent: Sep. 9, 2014

(54) IMPRINTING APPARATUS, IMPRINTING METHOD, AND MANUFACTURING METHOD OF UNEVEN PLATE

(75) Inventor: Takumi Ota, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 392 days.

(21) Appl. No.: 13/234,071

(22) Filed: Sep. 15, 2011

(65) Prior Publication Data

US 2012/0207931 A1    Aug. 16, 2012

(30) Foreign Application Priority Data

Feb. 15, 2011  (JP) ................. 2011-029984

(51) Int. Cl.
*B29C 59/02* (2006.01)
*G03F 7/00* (2006.01)
*H01L 21/027* (2006.01)

(52) U.S. Cl.
CPC ............ *G03F 7/0002* (2013.01); *H01L 21/027* (2013.01); *B29C 59/02* (2013.01); *Y10S 977/887* (2013.01)
USPC ............ 118/75; 118/100; 118/102; 118/665; 118/688; 977/887

(58) Field of Classification Search
USPC ............ 118/75, 100, 102, 665, 688; 977/887
See application file for complete search history.

(56) References Cited

U.S. PATENT DOCUMENTS

| 7,381,272 | B2 * | 6/2008 | Kasumi et al. ................ 118/500 |
| 2007/0228593 | A1 | 10/2007 | Jones et al. |
| 2007/0278712 | A1 | 12/2007 | Okushima et al. |
| 2009/0267268 | A1 | 10/2009 | Yoneda et al. |
| 2013/0020281 | A1 | 1/2013 | Wakamatsu et al. |

FOREIGN PATENT DOCUMENTS

| JP | 2007-165400 | 6/2007 |
| JP | 2007-320098 | 12/2007 |
| JP | 2008-270686 | 11/2008 |
| JP | 2009-88376 | 4/2009 |
| JP | 4481698 | 3/2010 |

OTHER PUBLICATIONS

Notice of Rejection issued by the Japanese Patent Office on Nov. 19, 2013, for Japanese Patent Application No. 2011-029984, and English-language translation thereof.

* cited by examiner

*Primary Examiner* — William Phillip Fletcher, III
(74) *Attorney, Agent, or Firm* — Finnegan, Henderson, Farabow, Garrett & Dunner, L.L.P.

(57) ABSTRACT

According to one embodiment, an imprinting apparatus includes an ejecting unit, a stage, a moving unit, and an observation unit. The ejecting unit ejects and drips a hardening resin material onto a substrate to be processed. The substrate to be processed is placed onto the stage. The moving unit relatively moves the ejecting unit and the stage. The observation unit observes the dripped hardening resin material and the pattern with the state in which the dripped hardening resin material and the pattern are overlaid on a plane, before the template is brought into contact with the hardening resin material.

7 Claims, 11 Drawing Sheets

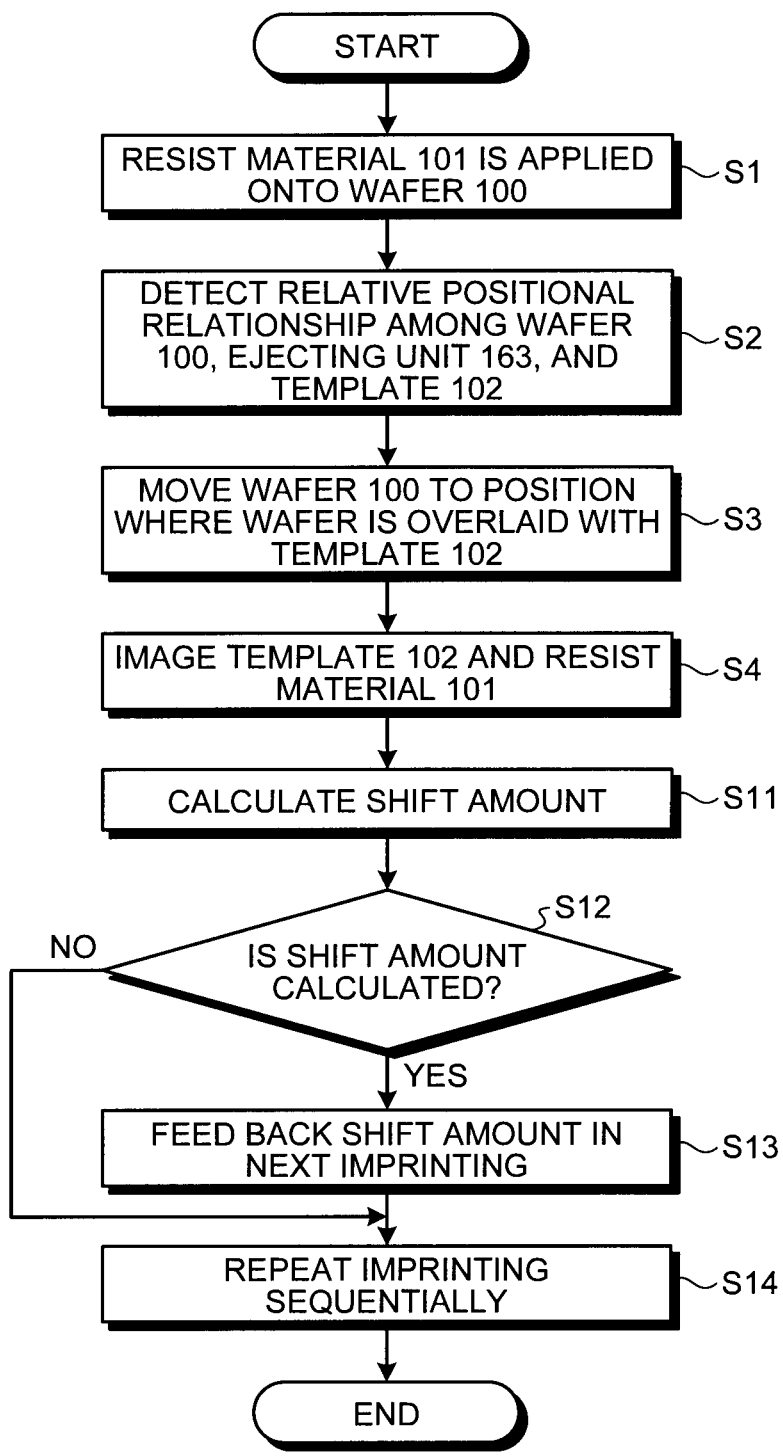

IMPRINTING APPARATUS, IMPRINTING METHOD, AND MANUFACTURING METHOD OF UNEVEN PLATE

CROSS-REFERENCE TO RELATED APPLICATIONS

This application is based upon and claims the benefit of priority from the prior Japanese Patent Application No. 2011-029984, filed on Feb. 15, 2011; the entire contents of which are incorporated herein by reference.

FIELD

Embodiments described herein relate generally to an imprinting apparatus, an imprinting method, and a manufacturing method of an uneven plate.

BACKGROUND

There has been known a nanoimprinting lithography technique (hereinafter simply referred to as nanoimprinting) as a manufacturing technique of a semiconductor integrated circuit. The nanoimprinting is a technique of bringing a template, having formed thereon a pattern of the semiconductor integrated circuit, into contact with a resist material (hardening resin material) applied onto a semiconductor wafer, so as to transfer the pattern formed on the template onto the resist material.

The hardening resin material is dripped from an ejecting unit, such as a dispenser, and applied onto the semiconductor wafer. In order to more precisely transfer the pattern formed into a shape of the template, the dripped amount or dripped position of the hardening resin material is controlled according to the shape and position of the pattern.

During the application of the hardening resin material described above, when the hardening resin material is dripped as being shifted from the intended dripped position, the shift is required to be detected as quickly as possible.

BRIEF DESCRIPTION OF THE DRAWINGS

FIG. 11 is a flowchart for describing a flow of the feedback of the shift amount executed by the imprinting apparatus;

DETAILED DESCRIPTION

In general, according to one embodiment, an imprinting apparatus drips a hardening resin material onto a substrate to be processed, and brings a template into contact with the hardening resin material dripped onto the substrate to be processed so as to transfer a pattern that is formed to have irregularities. The imprinting apparatus includes an ejecting unit, a stage, a moving unit, and an observation unit. The ejecting unit ejects and drips a hardening resin material onto a substrate to be processed. The substrate to be processed is placed onto the stage. The moving unit relatively moves the stage and the ejecting unit in order to drip the hardening resin material on a desired position. The observation unit observes the dripped hardening resin material and the pattern with the state in which the dripped hardening resin material and the pattern are overlaid on a plane, before the template is brought into contact with the hardening resin material.

Exemplary embodiments of an imprinting apparatus, an imprinting method, and a manufacturing method of an uneven plate will be explained below in detail with reference to the accompanying drawings. The present invention is not limited to the following embodiments.

Figure 1A:
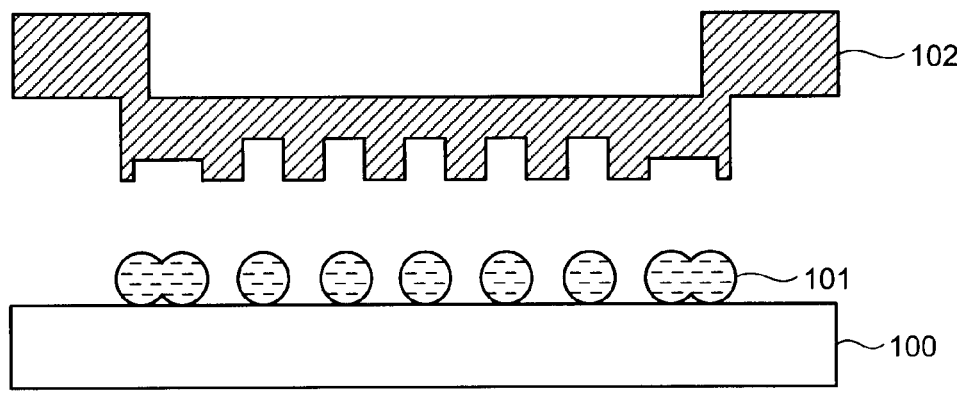
FIG. 1A is a view for describing a transfer process in a nanoimprinting.
Figure 1B:
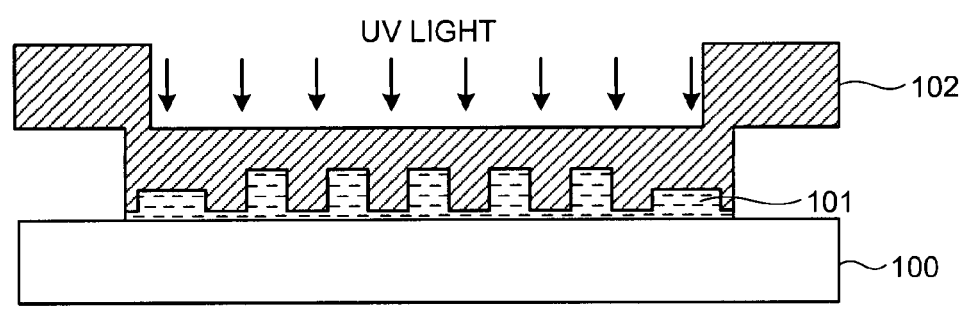
FIG. 1B is a view for describing the transfer process in the nanoimprinting.
Figure 1C:
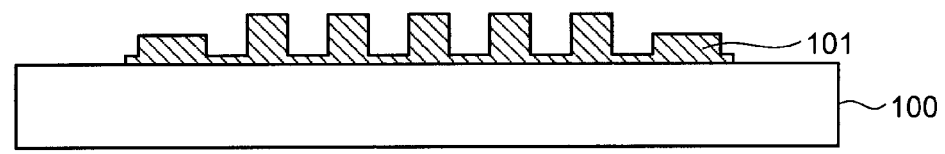
FIG. 1C is a view for describing the transfer process in the nanoimprinting.
Figure 2:
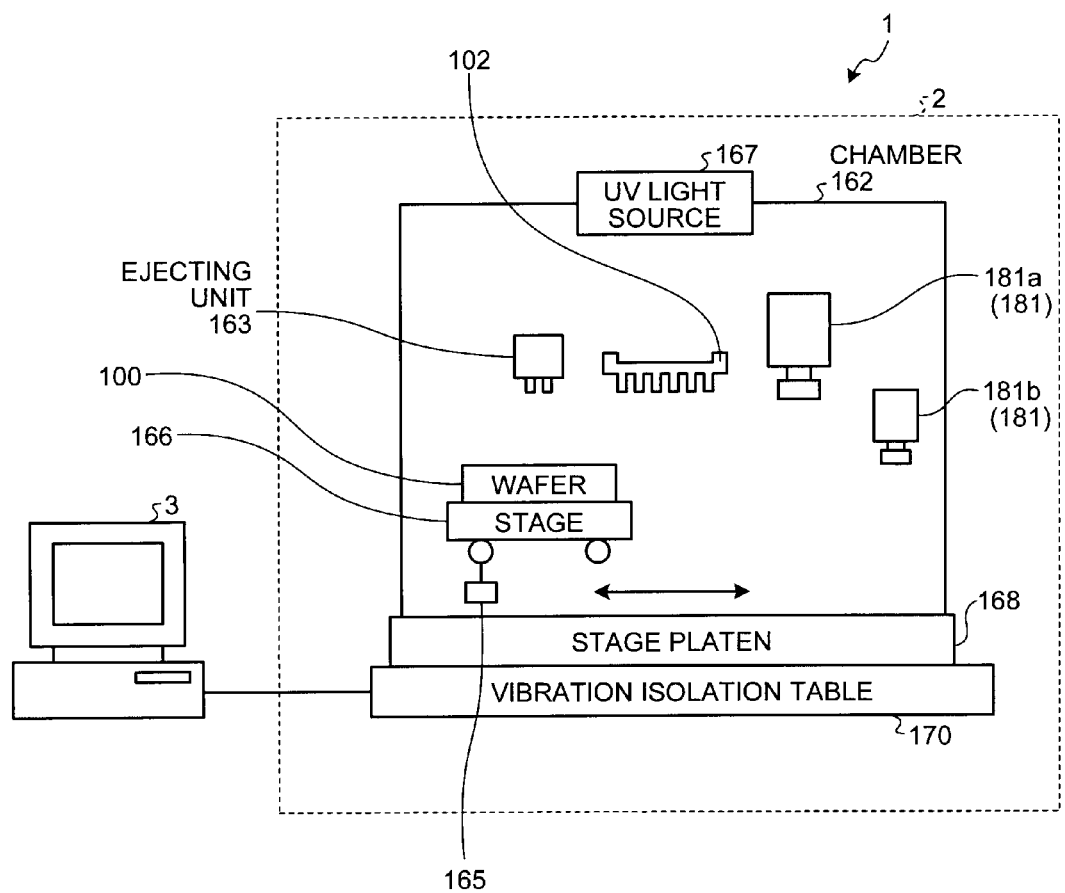
FIG. 2 is a block diagram illustrating a schematic structure of an imprinting apparatus according to a first embodiment.

A general transfer process with a nanoimprinting will firstly be described. FIGS. 1A to 1C are views for describing a transfer process in the nanoimprinting. FIG. 2 is a block diagram illustrating a schematic structure of an imprinting apparatus. An optical nanoimprinting will be described here as one example, wherein a resist (photo-curable resin material) is cured by an irradiation of ultraviolet light.

During the transfer process, a resist material 101 (hardening resin material) is applied onto a wafer 100 (one example of a substrate to be processed) that is a subject to be processed as illustrated in FIG. 1A. An imprinting apparatus 1 has an ejecting unit 163 that ejects the resist material 101 to the wafer 100.

A position where the resist material 101 is dripped is determined based upon a pattern formed to have irregularities on a template 102. For example, the dripping density increases at the portion having high pattern density, while the dripping density decreases at the portion having low pattern density.

Next, the template 102 is brought into contact with the wafer 100 having the resist material 101 applied thereon. With this process, the resist material 101 enters concave portions of the pattern formed on the template 102 due to a capillary action. After the resist material 101 sufficiently enters the concave portions, an ultraviolet light is irradiated from above the template 102 as illustrated in FIG. 1B. The template 102 may be pressed against the wafer 100.

The template 102 is made of a material, such as a quartz, which transmits the ultraviolet light (UV light). Therefore, the UV light irradiated from above the template 102 passes through the template 102 to irradiate the resist material 101. The resist material 101 is cured by the irradiation of the UV light.

Figure 10:
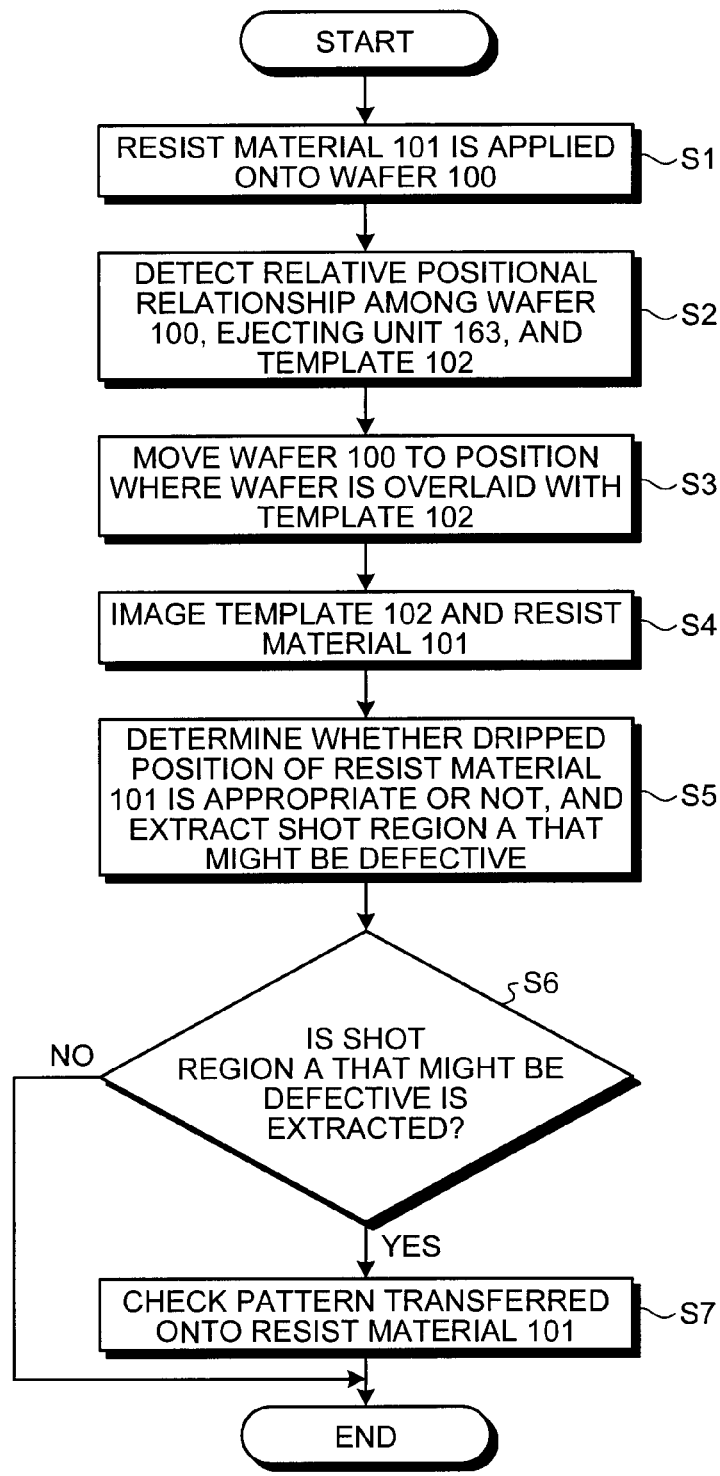
FIG. 10 is a flowchart for describing a flow of the check of the pattern transferred from the applied resist material by the imprinting apparatus.

After the resist material 101 is cured, the template 102 is removed. With this process, the pattern formed on the template 102 is transferred onto the resist material 101 on the wafer 100 as illustrated in FIG. 10.

Subsequently, the imprinting apparatus 1 will be described in detail. The imprinting apparatus 1 includes an imprinting unit 2 and an imprint control unit 3. The imprint control unit 3 controls the imprinting unit 2.

In the imprinting unit 2, a stage 166, the template 102, a moving unit 165, an ejecting unit 163, a UV light source 167, an imaging device 181, and the like are arranged in a same chamber 162. The chamber 162 is supported by a stage platen 168 and a vibration isolation table 170.

The wafer 100 is placed onto the stage 166 in the chamber 162. The stage 166 can move in the chamber 162 by the drive of the moving unit 165. Since the stage 166 moves in the chamber 162, the stage 166 allows the wafer 100 to move below the ejecting unit 163, the template 102, and the imaging device 181. When the resist material 101 is dripped from the ejecting unit 163, the stage 166 allows the wafer 100 to move such that the resist material 101 is dripped on a desired position. The moving unit 165 is, for example, a motor.

Figure 3:
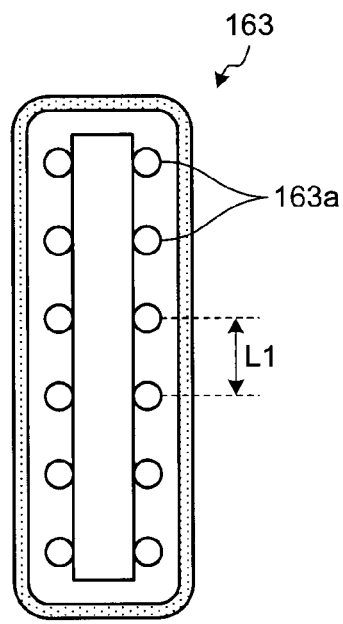
FIG. 3 is a view illustrating a schematic structure of an ejecting unit, as viewed from an ejecting port.

The ejecting unit 163 applies the resist material 101 onto the wafer 100 with an ink jet method. FIG. 3 is a view illustrating a schematic structure of the ejecting unit 163, as viewed from an ejecting port 163a. The ejecting unit 163 has plural ejecting ports 163a for ejecting the resist material 101 in the form of a droplet, wherein the ejecting ports 163a are arranged in two rows. Since the ejecting unit 163 has plural ejecting ports 163a, the ejecting unit 163 can eject plural droplets at a time.

Figure 4:
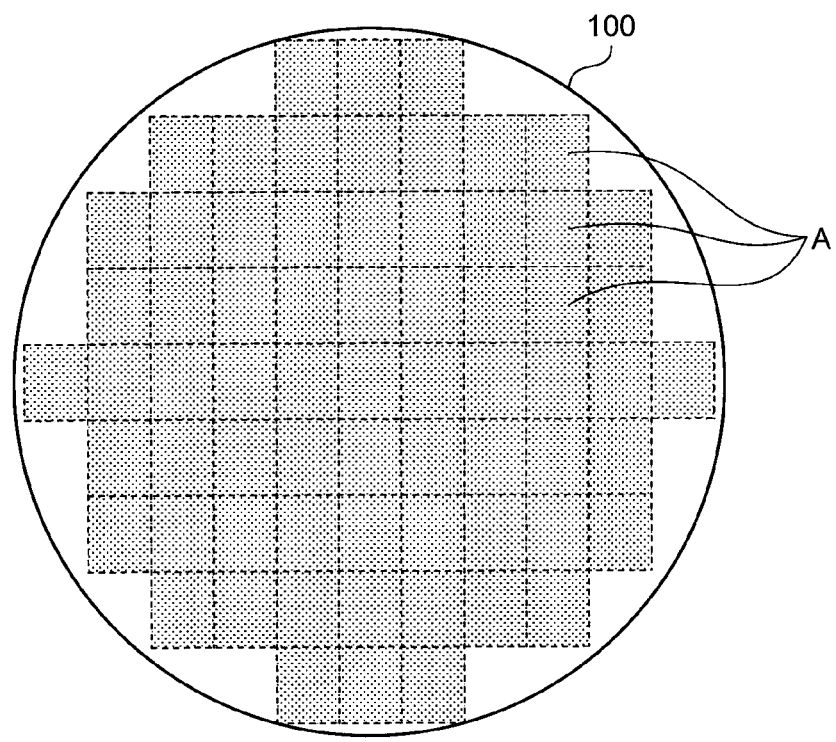
FIG. 4 is a plan view of a wafer for describing a shot arrangement.

FIG. 4 is a plan view of the wafer 100 for describing a shot arrangement. The imprinting mechanism of the imprinting unit 2 executes a step & repeat method, i.e., it performs an imprinting for every shot region A illustrated in FIG. 4. Specifically, after the resist material 101 is applied, and the pattern is transferred onto one shot region A, the wafer 100 is moved, and then, the resist material 101 is applied and the pattern is transferred to the adjacent other shot region A. Specifically, the ejecting unit 163 drips the resist material 101 to the wafer 100 in an amount corresponding to one shot at a time.

The pattern formed to have irregularities is formed on the template 102. The imprinting mechanism of the imprinting unit 2 is a step & repeat method. Therefore, irregularities for one shot are formed on the template 102. The pattern formed on the template 102 includes a device pattern (first pattern) needed for allowing a final product, which is individually cut from the wafer 100, to function as a semiconductor integrated circuit, and a monitor pattern (second pattern) for observing whether the resist material 101 is dripped on an appropriate position of the wafer 100 or not. The monitor pattern is formed on the region, out of the shot regions, where the device pattern is not formed. Specifically, the pattern transferred by the monitor pattern is formed with little relevance to the function as the semiconductor integrated circuit.

Figure 5A:
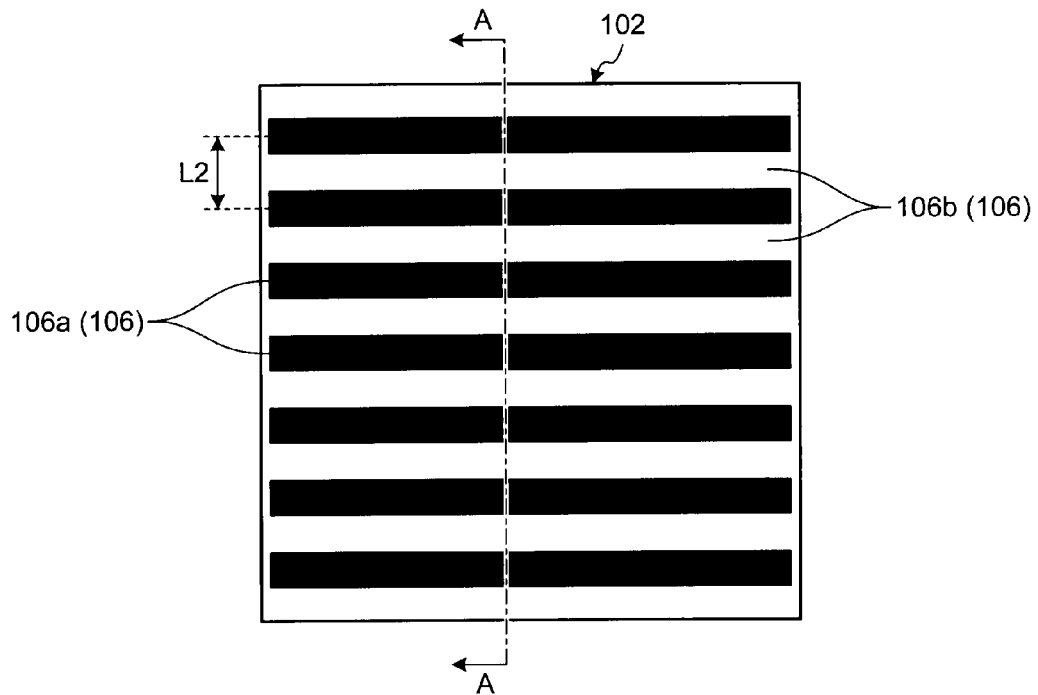
FIG. 5A is a partial enlarged plan view of a portion of a template where a monitor pattern is formed.
Figure 5B:
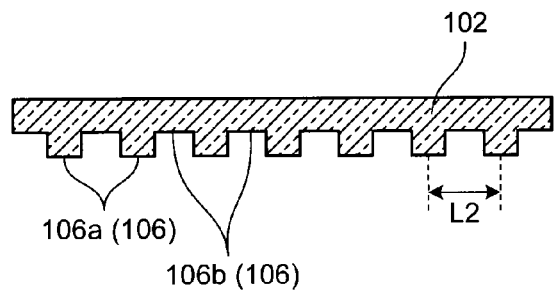
FIG. 5B is a sectional view taken along a line A-A in FIG. 5A.
Figure 5C:
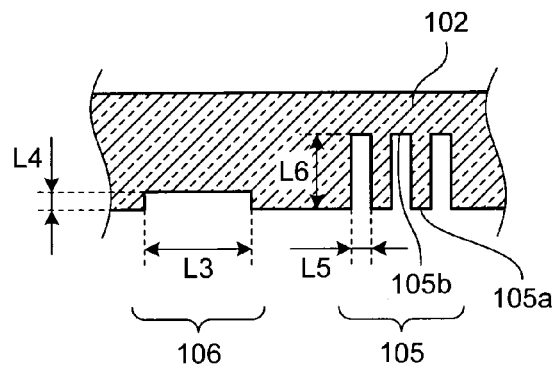
FIG. 5C is a view illustrating a sectional structure of a device pattern and the monitor pattern formed on the template.

FIG. 5A is a partial enlarged plan view of the portion of the template 102 where the monitor pattern 106 is formed. FIG. 5B is a sectional view taken along a line A-A in FIG. 5A. FIG. 5C is a view illustrating a sectional structure of the device pattern 105 and the monitor pattern 106 formed on the template 102.

As illustrated in FIGS. 5A and 5B, the monitor pattern 106 has convex portions 106a and concave portions 106b that are alternately formed in line. Meanwhile the convex portions 106a are painted with black for clear understanding in FIG. 5A, a paint is not actually applied on the convex portions 106a (the same is true for the other drawings). A pitch L2 between the convex portions 106a of the monitor pattern 106 is substantially equal to a pitch L1 (see FIG. 3) between the ejecting ports 163a of the ejecting unit 163.

As illustrated in FIG. 5C, a ratio of a depth L4 to a width L3 of the concave portion 106b of the monitor pattern 106 is smaller than a ratio of a depth L6 to a width L5 of the concave portion 105b of the device pattern 105 (i.e., L4/L3<L6/L5). Meanwhile described in detail below, the concave portion 106b of the monitor pattern 106 is formed to have a width larger than the width of the concave portion 105b of the device pattern 105 in order to observe the dripped position of the resist material 101. Therefore, force by which the resist material 101 tries to enter the concave portion 106b due to the capillary action decreases. Since the concave portion 106b is formed to be shallow in order that the resist material 101 surely enters the concave portion 106b, the above-mentioned inequality of L4/L3<L6/L5 is established.

The imaging device 181 includes a first imaging device (observation unit) 181a and a second imaging device 181b. The first imaging device 181a is provided for observing the dripped position of the resist material 101 to the wafer 100. The first imaging device 181a is, for example, a CCD camera. The imaging device 181 images the monitor pattern 106 formed on the template 102 and the resist material 101 dripped onto the wafer 100 as being overlaid with each other on a plane. In FIG. 2, the first imaging device 181a is arranged at the position hindering the irradiation of the UV light from the UV light source 167. However, it may be moved to the position where it does not hinder the irradiation of the UV light during the irradiation of the UV light.

Figure 6:
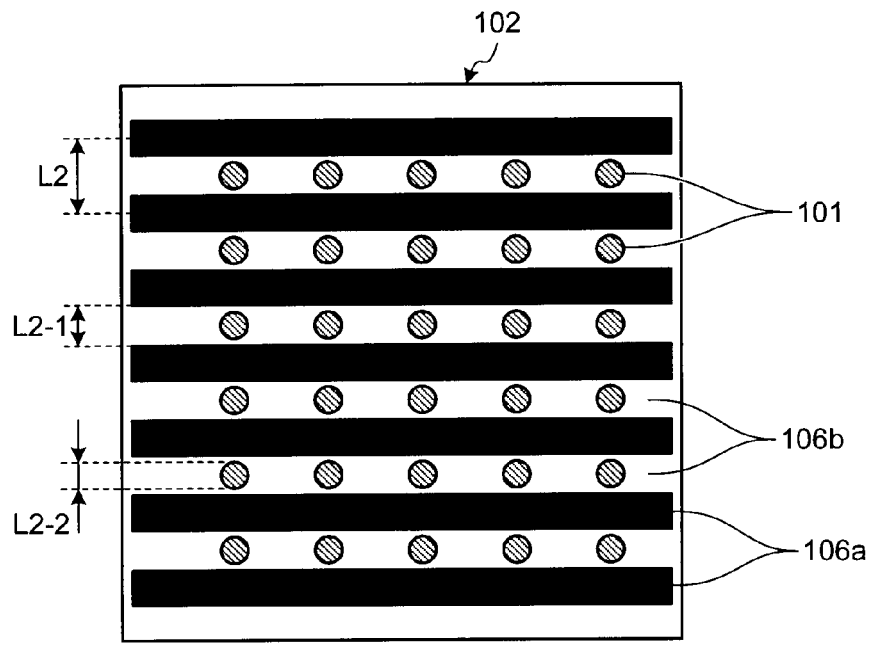
FIG. 6 is a view illustrating an example of the result of the observation by a first imaging device.

FIG. 6 is a view illustrating an example of the result of the observation by the first imaging device 181a. The template 102 is made of a quartz. Therefore, even when the template 102 and the resist material 101 are overlaid with each other, and the resultant is imaged from the side of the template 102, the resist material 101 can be observed through the template 102. The convex portions 106a of the monitor pattern 106 are formed to have the pitch substantially equal to the pitch L1 between the ejecting ports 163a of the ejecting unit 163. Therefore, the resist material 101 is overlaid on the portion between the convex portions 106a, i.e., on substantially the center of the concave portion 106b. However, when the precision in forming the ejecting ports 163a onto the ejecting unit 163 is poor, or when the precision in moving the wafer 100 is poor, the dripped position of the resist material 101 might be shifted from the center of the concave portion 106b.

If the space between the convex portions 106a, i.e., the width L2-1 of the concave portion 106b, is made substantially equal to the planar outer diameter L2-2 of the resist material 101 dripped onto the wafer 100 in a fixed amount, the shift of the dripped position is easy to be determined even when the dripped position is slightly shifted, because the resist material 101 and the convex portion 106a are overlaid with each other.

Figure 7:
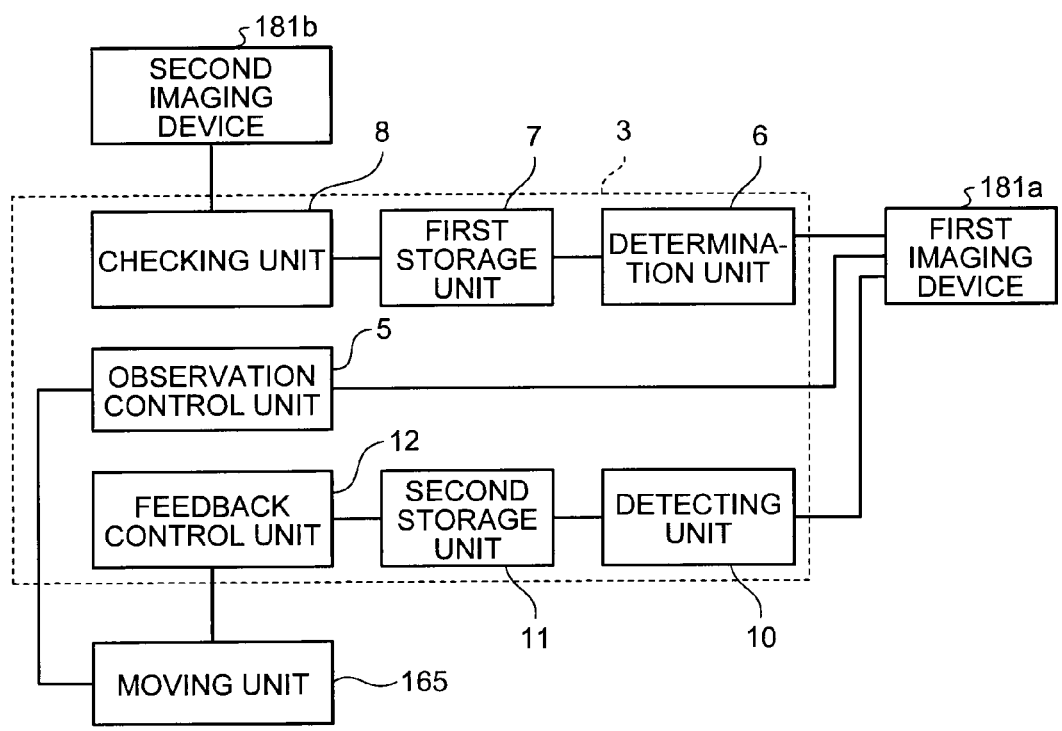
FIG. 7 is a block diagram illustrating a schematic configuration of an imprint control unit.

Next, the observation of the shift of the dripped position of the resist material 101 will be described in more detail. FIG. 7 is a block diagram illustrating a schematic configuration of the imprint control unit 3. The imprint control unit 3 includes an observation control unit 5, a determination unit 6, a first storage unit 7, a checking unit 8, a detecting unit 10, a second storage unit 11, and a feedback control unit 12.

The observation control unit 5 controls the first imaging device 181a to observe the dripped position of the resist material 101. The observation control unit 5 allows the first imaging device 181a to image the resist material 101 on the wafer 100 and the template 102 with the state in which the wafer 100 and the template 102 are overlaid on a plane. In particular, the observation control unit 5 allows the first imaging device 181a to image the monitor pattern 106 and the resist material 101. The observation control unit 5 generates a positional instruction to the moving unit 165 to move the wafer 100 in such a manner that the dripped resist material 101 is overlaid with the concave portion 106b of the monitor pattern 106, when it is supposed that the resist material 101 is dripped on an appropriate position, and the stage 166 is moved by the moving unit 165 without any error. Before the template 102 is brought into contact with the wafer 100, the first imaging device 181a makes an image-capture.

Before the template 102 is brought into contact with the wafer 100, there is a gap between the template 102 and the wafer 100. Therefore, the resist material 101 is imaged in a state in which the resist material 101 does not enter the concave portions 105b and 106b. The imaged information is transmitted to the determination unit 6 and the detecting unit 10 from the first imaging device 181a.

The determination unit 6 determines whether the resist material 101 is dripped onto an appropriate position on the wafer 100 or not based upon the information imaged by the first imaging device 181a.

Figure 8A:
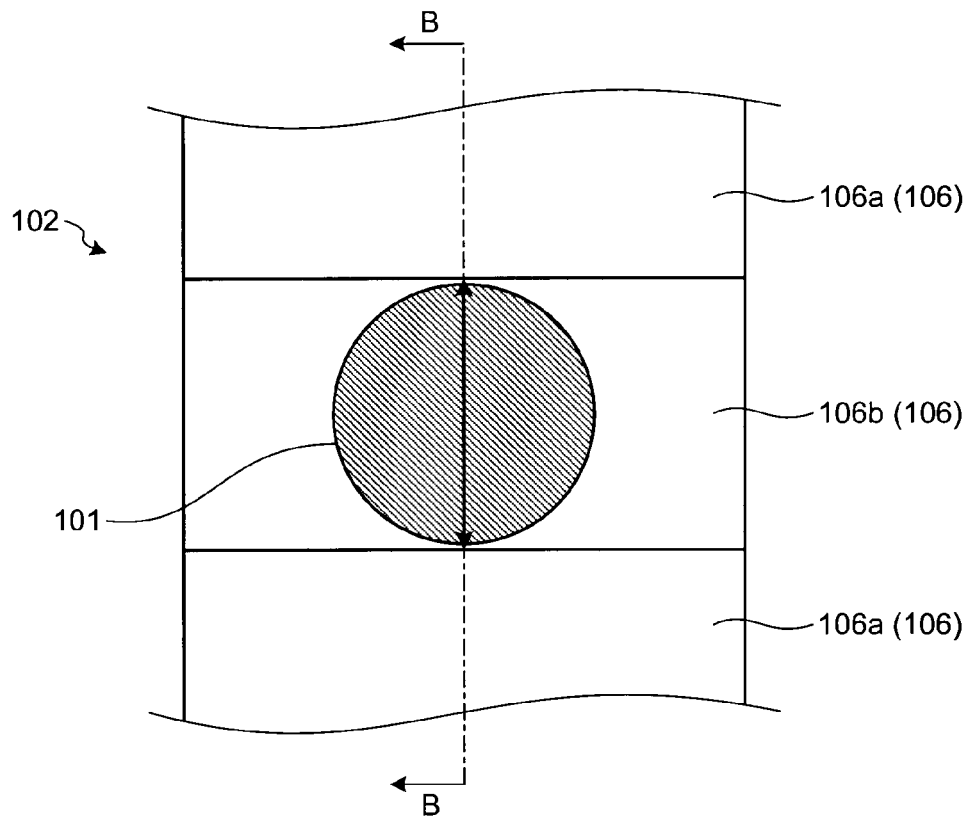
FIG. 8A is a view for describing the result of the observation when a determination unit determines that the resist material is dripped onto an appropriate position.
Figure 8B:
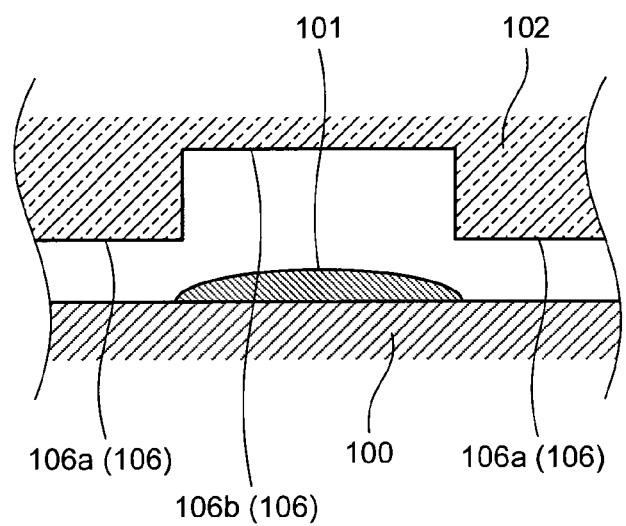
FIG. 8B is a sectional view taken along a line B-B in FIG. 8A.
Figure 9A:
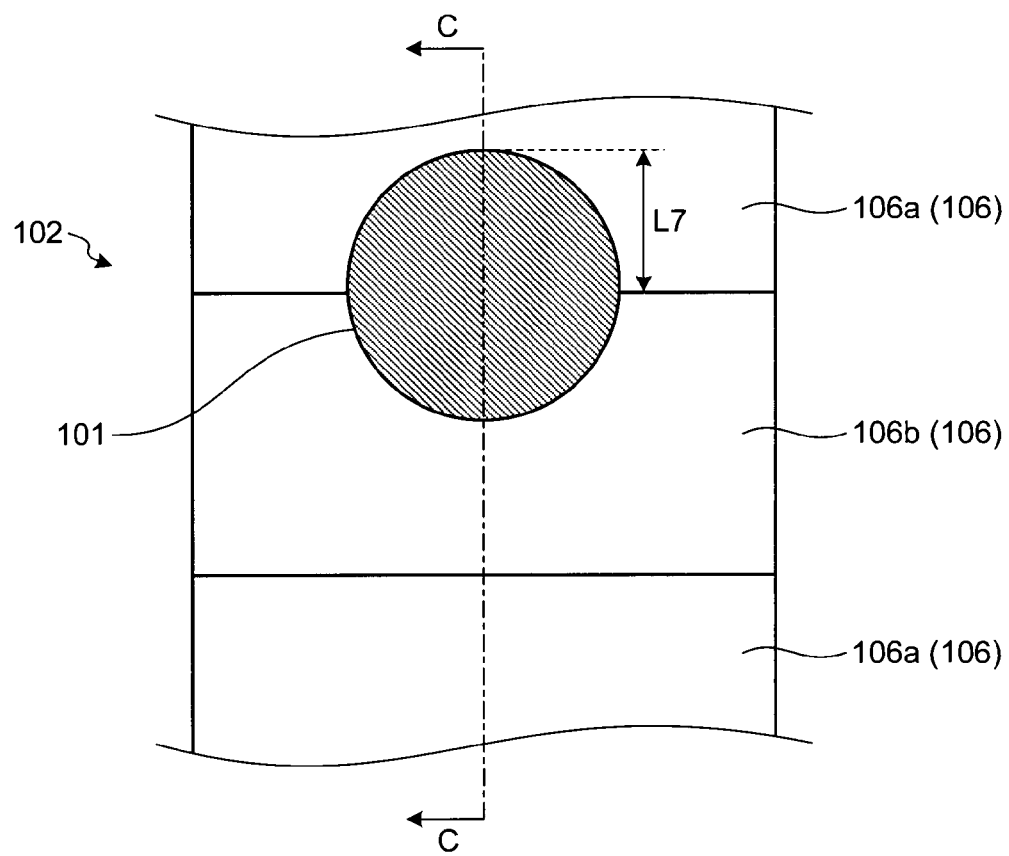
FIG. 9A is a view for describing the result of the observation when the determination unit determines that the resist material is dripped onto an inappropriate position.
Figure 9B:
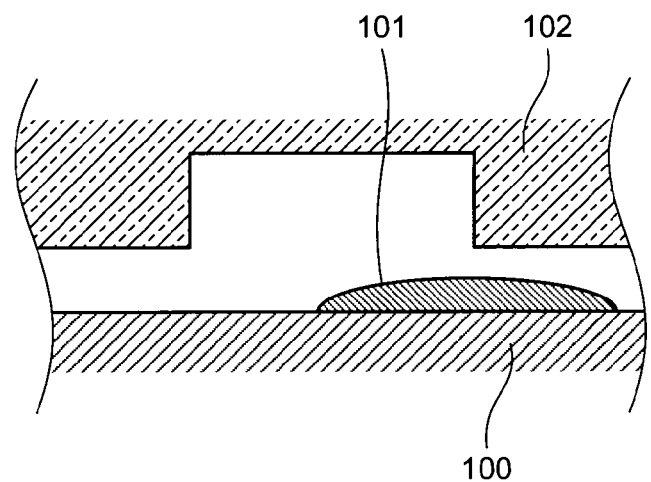
FIG. 9B is a sectional view taken along a line C-C in FIG. 9A.

FIG. 8A is a view for describing the result of the observation when the determination unit 6 determines that the resist material 101 is dripped onto the appropriate position. FIG. 8B is a sectional view taken along a line B-B in FIG. 8A. FIG. 9A is a view for describing the result of the observation when the determination unit 6 determines that the resist material 101 is dripped onto an inappropriate position. FIG. 9B is a sectional view taken along a line C-C in FIG. 9A.

The pitch L2 (see FIG. 6) between the convex portions 106a of the monitor pattern 106 is substantially equal to the pitch L1 (see FIG. 3) between the ejecting ports 163a of the ejecting unit 163 in the present embodiment. Therefore, the resist material 101 is located between the convex portions 106a as illustrated in FIG. 8A. When the width L2-1 of the concave portion 106b is made substantially equal to the planar outer diameter L2-2 of the resist material 101 dripped onto the wafer 100 in a fixed amount, the gap between the convex portion 106a and the resist material 101 can be eliminated. The determination unit 6 determines that the resist material 101 is dripped onto the appropriate position, when the convex portion 106a of the monitor pattern 106 and the resist material 101 are not overlaid with each other as illustrated in FIGS. 8A and 8B. When the resist material 101 and the convex portion 106a are overlaid with each other as illustrated in FIGS. 9A and 9B, the determination unit 6 determines that the resist material 101 is not dripped onto the appropriate position.

Every time the resist material 101 is applied onto the plural shot regions A as illustrated in FIG. 4, the determination unit 6 repeatedly determines the dripped position before the template 102 is brought into contact with the wafer 100.

If there is a shift in the dripped position of the resist material 101 at the region where the monitor pattern 106 is formed, it is considered that there is also a shift in the dripped position of the resist material 101 even at the region where the device pattern 105 is formed. The application amount or the dripped position of the resist material 101 is controlled according to the density of the device pattern 105. Therefore, when the dripped position of the resist material 101 is shifted, a defective pattern transfer might be caused.

In view of this, the checking unit 8 extracts the shot region A (the shot region A that might be defective), on which the device pattern 105 might not appropriately be transferred because the resist material 101 is not dripped onto the appropriate position, based upon a predetermined basis using the determination result stored in the first storage unit 7. For example, when the resist materials 101 in a predetermined ratio (e.g., 30%) or more of the plural resist materials 101 illustrated in FIG. 6 are not dripped onto the appropriate position, the shot region A at this time is extracted as the shot region A that might be defective. For example, in the chamber 162 in the imprinting unit 2, a helium gas is blown to the wafer 100. When the helium gas is too strongly blown, many resist materials 101 are dripped onto the inappropriate position, which might cause a defect on the transferred pattern.

The above-mentioned predetermined basis can be changed. The shot region A may be extracted every time the pattern transfer to the respective shot regions A is completed, or may be extracted after the pattern transfer (the transfer to all shot regions A illustrated in FIG. 4) to the entire wafer 100 is executed.

The checking unit 8 checks the pattern transferred onto the resist material 101 by the device pattern 105 on the shot region A that might be defective. For example, the checking unit 8 checks whether the transferred pattern has a missing part or not. Specifically, the checking unit 8 checks the shot region A, which might be defective, with the use of the second imaging device 181b. An imaging device that can take an image with higher definition than the first imaging device 181a is used for the second imaging device 181b. For example, a microscope can be used as the second imaging device 181b. The device pattern 105 is formed more finely than the monitor pattern 106, so that the second imaging device 181b, which can take an image with higher definition than the first imaging device 181a, is employed.

FIG. 10 is a flowchart for describing a flow of the check of the pattern transferred from the applied resist material 101 by the imprinting apparatus 1. The resist material 101 is firstly applied onto the wafer 100 (step S1). Next, the relative positional relationship among the wafer 100, the ejecting unit 163, and the template 102 is detected (step S2), and then, the wafer 100 is moved to the position where the wafer 100 is overlaid with the template 102 (step S3).

The template 102 and the resist material 101 are then imaged (step S4) so as to determine whether the dripped position of the resist material 101 is appropriate or not. With this, the shot region A that might be defective is extracted (step S5).

If the shot region A that might be defective is extracted (Yes in step S6), the pattern transferred onto the resist material 101 at this shot region A is checked (step S7). If the shot region A that might be defective is not extracted (No in step S6), the pattern transferred onto the resist material 101 is not checked. The pattern on the shot region A other than the extracted shot region A is not checked, even if the shot region A that might be defective is extracted.

The detecting unit 10 calculates the shift amount of the dripped position of the resist material 101 based upon the information imaged by the first imaging device 181a. When the resist material 101 is dripped onto the appropriate position as illustrated in FIG. 8A, a gap is hardly formed between the resist material 101 and the convex portion 106a. Therefore, the shift amount becomes 0. On the other hand, when the resist material 101 is dripped as being shifted as illustrated in FIG. 9A, the overlap between the resist material 101 and the convex portion 106a becomes a shift amount L7. The detecting unit 10 allows the second storage unit 11 to store the calculated shift amount.

The feedback control unit 12 feeds back the shift amount stored in the second storage unit 11 for the movement of the stage 166 in the next process. For example, when the shift amount is calculated for almost all of plural resist materials 101 illustrated in FIG. 6, it is considered that there is a certain error in the moving control of the stage 166 by the moving unit 165. Therefore, the feedback control is executed in which the average value of the calculated shift amount is added to or subtracted from the positional instruction to the moving unit 165 as an error amount. With this control, the resist material 101 can be dripped under the condition that the affect caused by the error is minimized. The error described above might be generated due to a factor unique to the imprinting apparatus 1, such as a deformation of a member constituting the moving unit 165 or the stage 166, or the precision in forming the ejecting ports 163a to the ejecting unit 163.

FIG. 11 is a flowchart for describing a flow of the feedback of the shift amount executed by the imprinting apparatus 1. The processes from step S1 to step S4 are the same as those in FIG. 10, so that the description will not be repeated. After step S4, the shift amount is calculated by the detecting unit 10 (step S11). When the shift amount is calculated (Yes in step S12), the shift amount is fed back to the moving amount of the stage 166 during the next imprinting (step S13), and then, the imprinting is sequentially repeated (with step & repeat method) (step S14). When the shift amount is not calculated (No in step S12), the shift amount is not fed back to the moving amount of the stage 166, and then, the imprinting is sequentially repeated (step S14).

As described above, before the template 102 is brought into contact with the wafer 100, the shot region A that might be defective can be extracted based upon the dripped position of the resist material 101. The pattern transferred at the shot region A that might be defective is only checked. Therefore, man-hour can be reduced, compared to the case in which the patterns on all shot regions A are checked, whereby the efficiency in the imprinting can be enhanced.

The calculated shift amount is fed back to the movement of the stage 166. Accordingly, the shift in the dripped position, which is caused by the factors unique to the imprinting apparatus 1, can be corrected in the subsequent imprinting process, whereby the defect caused on the transferred pattern can be reduced.

In the present embodiment, a process of manufacturing a semiconductor integrated circuit (semiconductor substrate) with the imprinting has been described as one example. However, the present invention is not limited thereto. For example, the present invention is applicable to a manufacture of an uneven plate having fine irregularities formed on its surface, such as a compact disk (CD). Specifically, the present embodiment is applicable to the case in which the fine irregularities formed on the surface of the uneven plate are formed by the imprinting.

In the present embodiment, the imprint control unit 3 has both the structure (determination unit 6, first storage unit 7, checking unit 8, second imaging device 181b) for extracting and checking the shot region A that might be defective and the structure (detecting unit 10, second storage unit 11, feedback control unit 12) for feeding back the shift amount. However, the imprint control unit may have only one of the structures.

Figure 12A:
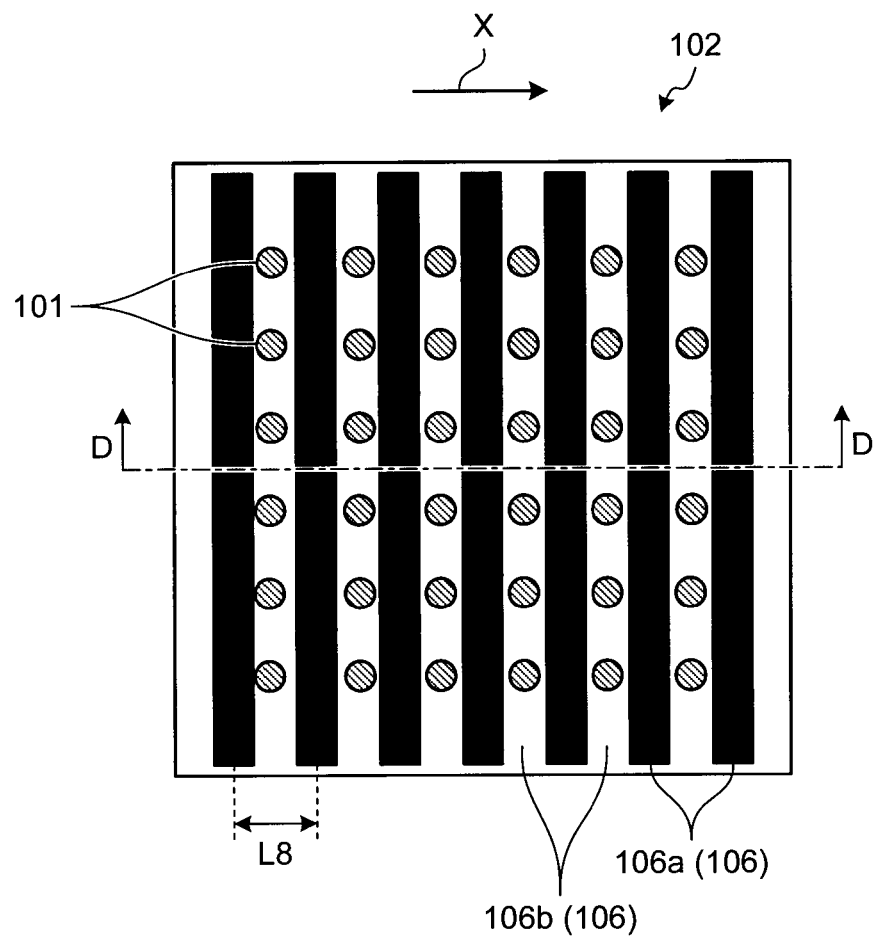
FIG. 12A is a view illustrating the result of the observation of the monitor pattern according to a modification 1 of the first embodiment.
Figure 12B:
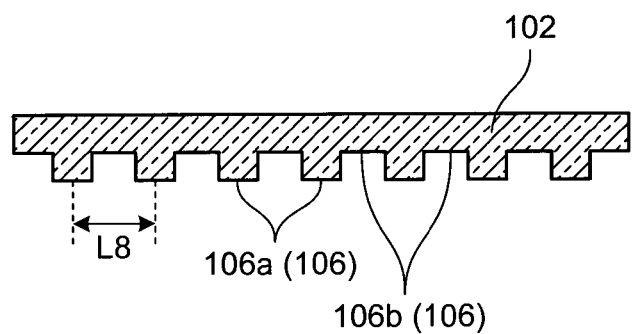
FIG. 12B is a view illustrating a sectional structure of the template according to the modification 1, i.e., is a sectional view taken along a line D-D in FIG. 12A.

FIG. 12A is a view illustrating the result of the observation of the monitor pattern 106 according to a modification 1 of the first embodiment. FIG. 12B is a view illustrating a sectional structure of the template 102 according to the modification 1, i.e., is a sectional view taken along a line D-D in FIG. 12A.

In the present modification, the convex portions 106a of the monitor pattern 106 are formed to have a pitch L8 that is substantially equal to the minimum operation pitch of the moving unit 165 (see FIG. 7), which moves the wafer (stage) along an arrow X. The resist material 101 is dripped at the timing when the stage 166 moves by one pitch of the minimum operation pitch, whereby the resist material 101 can be dripped at the position where the resist material 101 is overlaid with the concave portion 106b. When the resist material 101 and the convex portion 106a are overlaid with each other in this case, it is considered that an error is caused in the minimum operation pitch of the moving unit 165. Therefore, it is configured such that the positional instruction to which the error is fed back is generated. With this configuration, the resist material 101 can be dripped onto the appropriate position, which can prevent the generation of a defect on the transferred pattern.

Figure 13A:
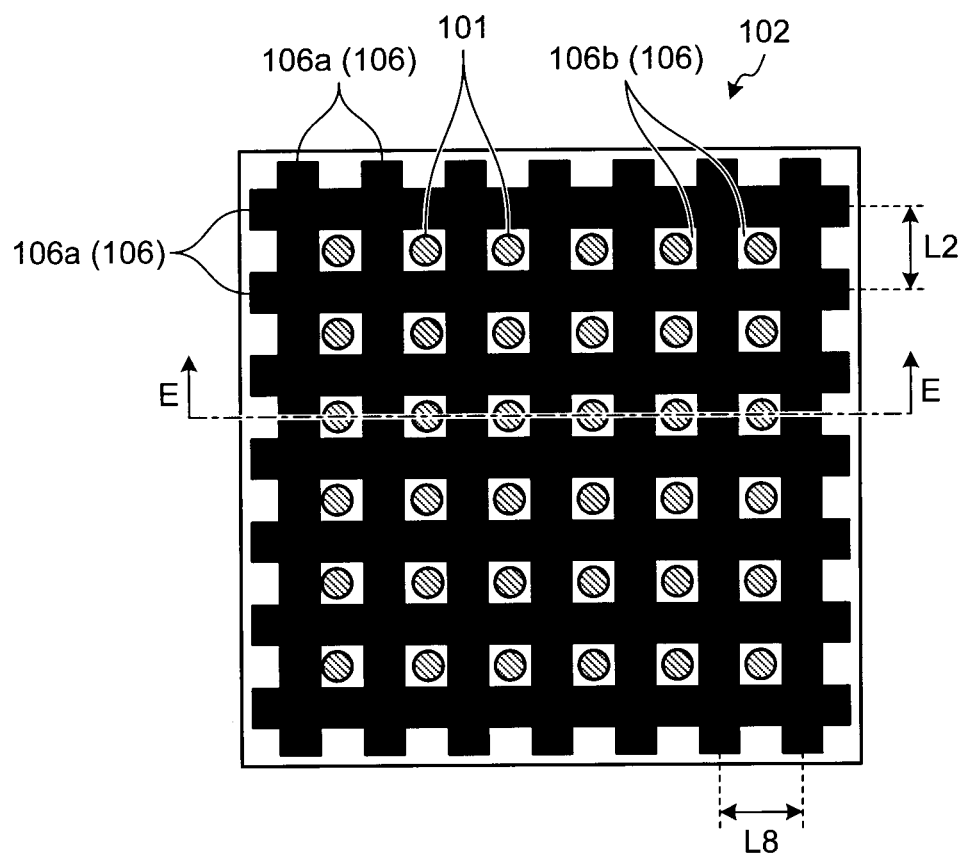
FIG. 13A is a view illustrating the result of the observation of the monitor pattern according to a modification 2 of the first embodiment.
Figure 13B:
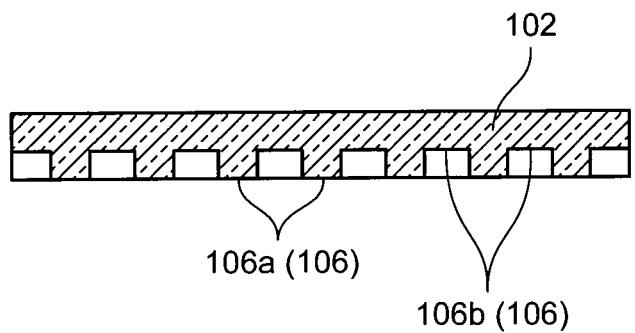
FIG. 13B is a view illustrating a sectional structure of the template according to the modification 2, i.e., is a sectional view taken along a line E-E in FIG. 13A.

FIG. 13A is a view illustrating the result of the observation of the monitor pattern 106 according to a modification 2 of the first embodiment. FIG. 13B is a view illustrating a sectional structure of the template 102 according to the modification 2, i.e., is a sectional view taken along a line E-E in FIG. 13A.

In this modification, the convex portions 106a of the monitor pattern 106 are formed in a matrix. For example, when the pitches of the convex portions 106a in the longitudinal direction and lateral direction are set as L2 and L8, respectively, and the resist material 101 is dripped at the timing when the stage 166 moves by one pitch of the minimum operation pitch, the resist material 101 is overlaid with the concave portion 106b formed on the convex portion 106a as illustrated in FIG. 13A.

As described above, when the convex portions 106a are formed in a matrix, the shift in the dripped position of the resist material 101 can be detected two-dimensionally, whereby the extraction of the shot region A that might be defective and the precision in the feedback of the shift amount can be enhanced.

A center of the convex portions 106a and a center of the resist material 101 may be calculated based upon the result of the observation. In this case, the shift amount of the center of the convex portions 106a and the center of the resist material 101 are calculated. The shot region A that might be defective is extracted and the shift amount is fed back based upon the result of the calculation.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the sprit of the inventions. The accompanying claims and their equivalents are intended to cover such forms or modifications as would fall within the scope and spirit of the inventions.

What is claimed is:

1. An imprinting apparatus that drips a hardening resin material onto a substrate to be processed, and brings a template into contact with the hardening resin material dripped onto the substrate to be processed so as to transfer a pattern that is formed to have irregularities, the imprinting apparatus comprising:
    an ejecting unit configured to eject and drip the hardening resin material onto the substrate to be processed;
    a stage on which the substrate to be processed is placed;
    a moving unit configured to relatively move the stage and the ejecting unit in order to drip the hardening resin material onto a desired position; and
    an observation unit configured to observe the dripped hardening resin material and the pattern in a state in which the dripped hardening resin material and the pattern are overlaid on a plane, before the template is brought into contact with the hardening resin material,
    wherein the template has a first pattern configured to transfer desired irregularities onto the hardening resin material, and a second pattern configured to observe the dripped position of the hardening resin material, and
    the observation unit observes the second pattern and the dripped hardening resin material.

2. The imprinting apparatus according to claim 1, wherein a ratio of a depth of a concave portion to a width of the concave portion of the second pattern is smaller than a ratio of a depth of a concave portion to a width of the concave portion of the first pattern.

3. The imprinting apparatus according to claim 1,
    wherein the ejecting unit has formed thereon ejecting ports configured to eject the hardening resin material at substantially a fixed pitch, and
    the space between the concave portions of the second pattern is substantially equal to the pitch of the ejecting ports.

4. The imprinting apparatus according to claim 1, wherein the space between the concave portions of the second pattern is substantially equal to a minimum operation pitch of the moving unit.

5. The imprinting apparatus according to claim 1, wherein the convex portions of the second pattern are formed in a matrix.

6. The imprinting apparatus according to claim 1, further comprising:
    a determination unit that determines whether the hardening resin material is dripped onto an appropriate position or not based upon the result of the observation by the observation unit; and
    a checking unit that checks the pattern transferred onto the hardening resin material when the determination unit determines that the dripped position is inappropriate.

7. The imprinting apparatus according to claim 1, further comprising:
    a shift detecting unit that detects a shift amount of the dripped position of the hardening resin material based upon the result of the observation by the observation unit, and
    a control unit that feeds back the shift amount to the moving unit to relatively move the stage and the ejecting unit.

* * * * *